(12) United States Patent
Yamashita et al.

(10) Patent No.: US 7,137,352 B2
(45) Date of Patent: Nov. 21, 2006

(54) PLASMA PROCESSING SYSTEM IN WHICH WAFER IS RETAINED BY ELECTROSTATIC CHUCK

(75) Inventors: Toshihiro Yamashita, Tokyo (JP); Hirotoshi Ise, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 1332 days.

(21) Appl. No.: 09/901,038

(22) Filed: Jul. 10, 2001

(65) Prior Publication Data

US 2002/0086546 A1 Jul. 4, 2002

(30) Foreign Application Priority Data

Dec. 28, 2000 (JP) .............................. 2000-403083

(51) Int. Cl.
*H01L 21/302* (2006.01)
(52) U.S. Cl. .................. 118/723 E; 118/728; 361/234; 156/345.47
(58) Field of Classification Search ................ 118/728, 118/723; 361/234; 156/345.43, 345.47, 156/345.28, 345.51, 345.44, 345.45, 345.46; 315/111.21; 279/128
See application file for complete search history.

(56) References Cited

U.S. PATENT DOCUMENTS 5,557,215 A * 9/1996 Saeki et al. .................. 324/765
5,665,166 A * 9/1997 Deguchi et al. ......... 118/723 E
5,790,365 A * 8/1998 Shel ............................ 361/234
5,868,848 A * 2/1999 Tsukamoto ............. 118/723 E
5,874,361 A * 2/1999 Collins et al. .............. 438/716
6,033,482 A * 3/2000 Parkhe ........................ 118/728

FOREIGN PATENT DOCUMENTS

JP 62054637 A * 3/1987
JP 07240458 A * 9/1995
JP 07250458 A * 9/1995

OTHER PUBLICATIONS

Burns and Roberts, An Introduction to Mixed-Signal Test, Feb. 8, 2001, Oxford University Press, Texas Instruments, p. 1.*

* cited by examiner

*Primary Examiner*—Parviz Hassanzadeh
*Assistant Examiner*—Michelle Crowell
(74) *Attorney, Agent, or Firm*—McDermott Will & Emery LLP

(57) ABSTRACT

A plasma processing system comprises a processing chamber into and from which processing gas is inlet and outlet; a pair of electrodes disposed so as to mutually oppose within the processing chamber; a RF feeding apparatus for generating plasma between the pair of electrodes; a retaining/removal apparatus for retaining a substrate to be processed on and removal from a sample table while one of the pair of electrodes is taken as the sample table; and a detection apparatus for detecting the electrostatic-chucking state of the substrate and for detecting removal state of electrical charges from the substrate, on the basis of variations in impedance arising between the sample table and the substrate.

8 Claims, 3 Drawing Sheets

PLASMA PROCESSING SYSTEM IN WHICH WAFER IS RETAINED BY ELECTROSTATIC CHUCK

BACKGROUND OF THE INVENTION

1. Field of the Invention

The present invention relates to a plasma processing system, and to a plasma processing method, and to a method of manufacturing a semiconductor device using the plasma processing system and method. More particularly, the present invention relates to a method of manufacturing a semiconductor device in which a wafer is chucked and secured by utilization of an electrostatic chuck.

2. Description of the Background Art

A method of manufacturing an integrated circuit called an IC or a LSI usually employs an etching process in a process of forming a pattern. In a system to be used for the etching process, there has been employed an electrostatic chuck for securing a wafer to an electrode. The wafer is secured by means of utilizing an electrostatic force developing in the electrode. The electrostatic force is generated by means of applying a high frequency, such as microwaves, to the inside of a processing chamber where the wafer is to be processed.

FIG. 3 is a view for describing the structure of a conventional plasma processing system (wafer etching system).

In FIG. 3, reference numeral 1 designates a wafer. For instance, there is used a Si wafer 8 inches in diameter as the wafer 1. Although not shown, a film to be etched, for example, an oxide film ($SiO_2$) is formed on the wafer 1. Reference numeral 2 designates an insulating coating placed on a power electrode 3 disposed in a processing chamber (not shown). The wafer 1 is to come into contact with the insulating coating 2. For instance, a film containing titania or alumina is used as material of the insulating coating 2. The power electrode 3 chucks and retains the wafer 1 thereon by way of the insulating coating 2. For instance, an aluminum alloy A5052 is used as material for the power electrode 3. Reference numeral 4 designates a matching circuit for matching the voltage of a high-frequency power supply 5 and the voltage applied to the power electrode 3.

The high-frequency power supply 5 produces a voltage for producing plasma to be used for effecting an etching reaction. Further, the high-frequency power supply 5 produces a voltage to be used for securing the wafer 1 to the power electrode 3. The voltage supplied by the high-frequency power supply 5 is about 1 KV, and a power supply frequency is 13.56 MHz. Reference numeral 6 designates a ground electrode serving as a ground at the time of development of the plasma. The size of the ground electrode 6 corresponds with the diameter of the wafer 1. An aluminum alloy A5052 is used as a material of the ground electrode 6. Reference numeral 7 designates a variable resistor used for adjusting the matching circuit 4. Thereby, the matching circuit 4 matches the power electrode 3 to the high-frequency power supply 5. Reference numeral 8 designates a DC (direct current) power supply capable of switching between application of a negative voltage and application of a positive voltage. Reference numeral 9 designates a cooling gas supplied from a cooling gas system (not shown), the cooling gas 9 being used for removal the wafer 1. For example, $N_2$ gas is used as the cooling gas 9.

Etching process of the wafer 1 is performed through use of the above system while the processing chamber is maintained in a high vacuum (usually $10^{-7}$ Torr or thereabouts).

Next, procedures for processing a wafer will be described.

First, the wafer 1 is transported onto the power electrode 3 by use of unillustrated transport apparatus, such as a robot. Next, a positive power of about 1 KV is applied from the DC power supply 8 to the power electrode 3. Thus, the wafer 1 is secured to the power electrode 3 by means of the electrostatic attracting force developing in the power electrode 3. At this time, an electrostatic attracting force of 600 g or more is exerted on the power electrode 3 in the vertical direction.

Next, a high-frequency voltage, which is used for developing plasma between the power electrode 3 and the ground electrode 6, is applied from the high-frequency power supply 5. Thereby, an etching process of the wafer 1 is performed. At this time, the matching circuit 4 matches the voltage of the high-frequency power supply 5 to the voltage applied to the power electrode 3.

After completion of the etching process, the polarity of the voltage, which is supplied by the DC power supply 8, to be used for chucking the wafer 1 is switched in the DC power supply 8. Namely, a maximum of −2 KV of negative voltage is applied to the power electrode 3. Thereby, electrical charges of the power electrode 3 are removed. Next, the cooling gas 9 to be used for removal the wafer 1 is supplied. Thus, the wafer 1 is removed from the power electrode 3. Finally, the wafer 1 removed from the power electrode 3 is transported from the power electrode 3 through use of transport apparatus, such as a robot.

The conventional wafer etching system (plasma processing system) sets forth the following problems.

The method of removing the wafer 1 using a cooling gas 9 fails to correctly remove electric charges from the wafer 1, and to detect the wafer 1, and to detect removal of the wafer 1 from the electrostatic chuck.

Therefore, deviation of the wafer 1 due to anomalous operation of a removal mechanism results in a transport failure or in a fracture of the wafer 1.

Further, the throughput of the wafer 1 is not improved for reasons of the failure to detect removal of the wafer, thus deteriorating productivity.

SUMMARY OF THE INVENTION

The present invention has been conceived to solve the previously-mentioned problems and a general object of the present invention is to provide a highly-productive plasma processing system, and is to provide a highly-productive plasma processing method, and is to provide a highly-productive method of manufacturing a semiconductor device.

A more specific object of the present invention is to remove electric charges correctly from a wafer at the time of removal of the wafer, that is, detection of removal of the wafer correctly, and to prevent a transport failure and a fracture in wafer, and to prevent a detection failure due to deviation of a wafer, and to increase throughput.

The above object of the present invention is attained by a following plasma processing system, and by a following plasma processing method, and by a following method of manufacturing a semiconductor device.

According to a first aspect of the present invention, a photo mask to be used for photolithography comprises a processing chamber into and from which processing gas is inlet and outlet; a pair of electrodes disposed so as to mutually oppose within the processing chamber; a RF feeding apparatus for generating plasma between the pair of electrodes; a retaining/removal apparatus for retaining a substrate to be processed on and removal from a sample table while one of the pair of electrodes is taken as the sample table; and a detection apparatus for detecting the electrostatic-chucking state of the substrate and for detecting removal state of electrical charges from the substrate, on the basis of variations in impedance arising between the sample table and the substrate.

In the plasma processing system, deviation of the wafer can be detected, thereby realizing stable processing and transport of the wafer. Further, throughput attributable to shortening of the wafer dechucking time can be improved. Further, the present invention yields an advantage of ability to optimize an electrostatic chucking voltage, and to stabilize chucking of the wafer and removal of electrical charges from the wafer.

According to a second aspect of the present invention, in a plasma processing method for inletting processing gas between a pair of electrodes disposed so as to mutually oppose within a processing chamber, the processing gas being discharged from the processing chamber after processing of a substrate to be processed, first, plasma is generated between the pair of electrodes. Next, the substrate is retained on a sample table by means of electrostatic chucking while one of the pair of electrodes is taken as the sample table. Further, the substrate is removed from the sample table by means of removing residual electrical charges from the substrate. Next, electrostatic chucking state of the substrate and removal state of electrical charges from the substrate are detected, on the basis of variations in impedance between the sample table and the substrate.

In the plasma processing method, there is yielded an advantage of ability to contribute to realization of stable processing and transport of a wafer, improved throughput attributable to shortening of a wafer dechucking time, an optimal electro static chucking voltage, and stable dechucking of a wafer and removal of electrical charges from a wafer.

According to a third aspect of the present invention, a method of manufacturing a semiconductor device use the above-mentioned plasma processing system or method. Accordingly, there is yielded an advantage of ability to provide a method of manufacturing a semiconductor device with good productivity and superior quality.

Other objects and further features of the present invention will be apparent from the following detailed description when read in conjunction with the accompanying drawings.

DETAILED DESCRIPTION OF THE PREFERRED EMBODIMENTS

Figure 1:
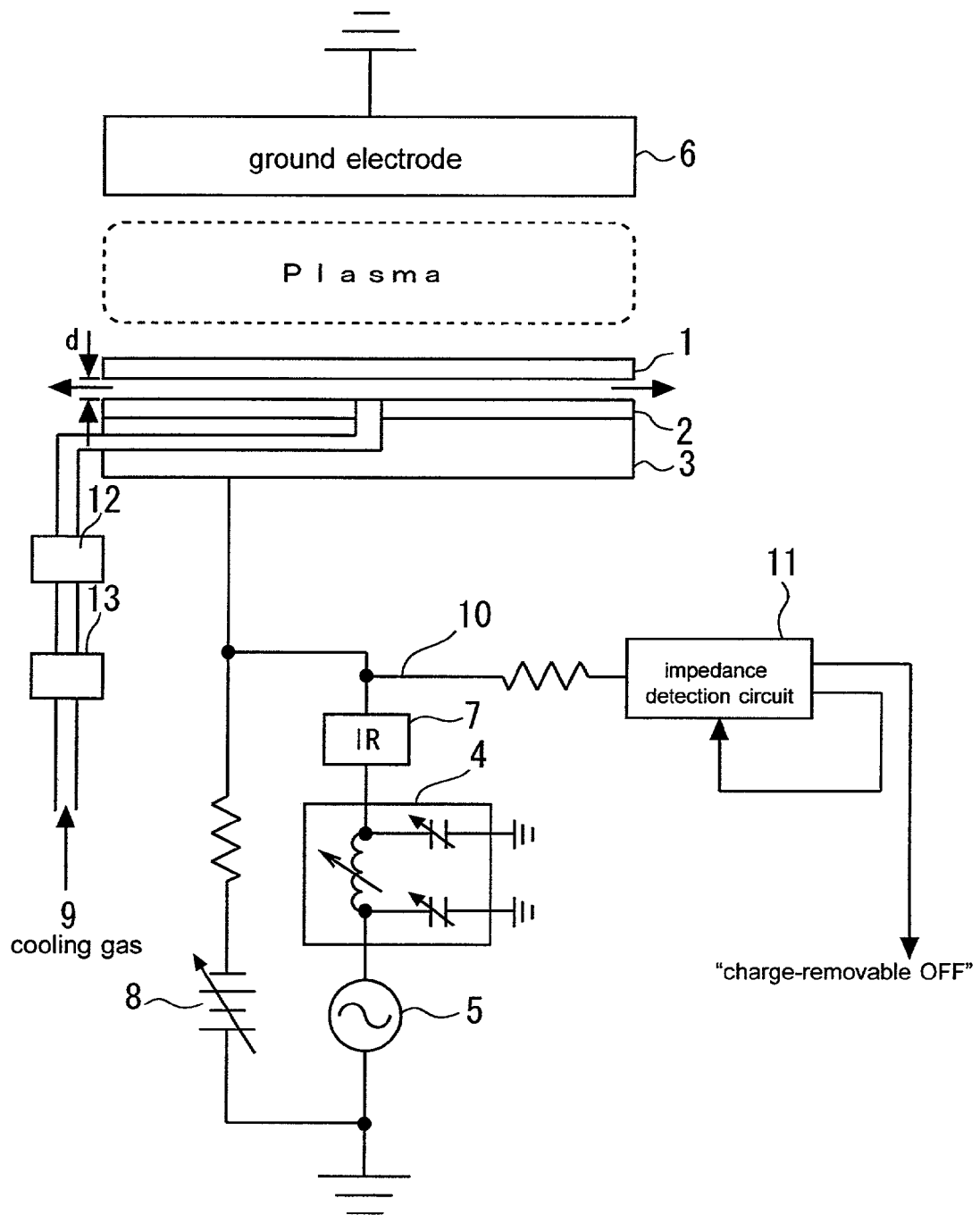
FIG. 1 is a view for describing the structure of a plasma processing system according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 3:
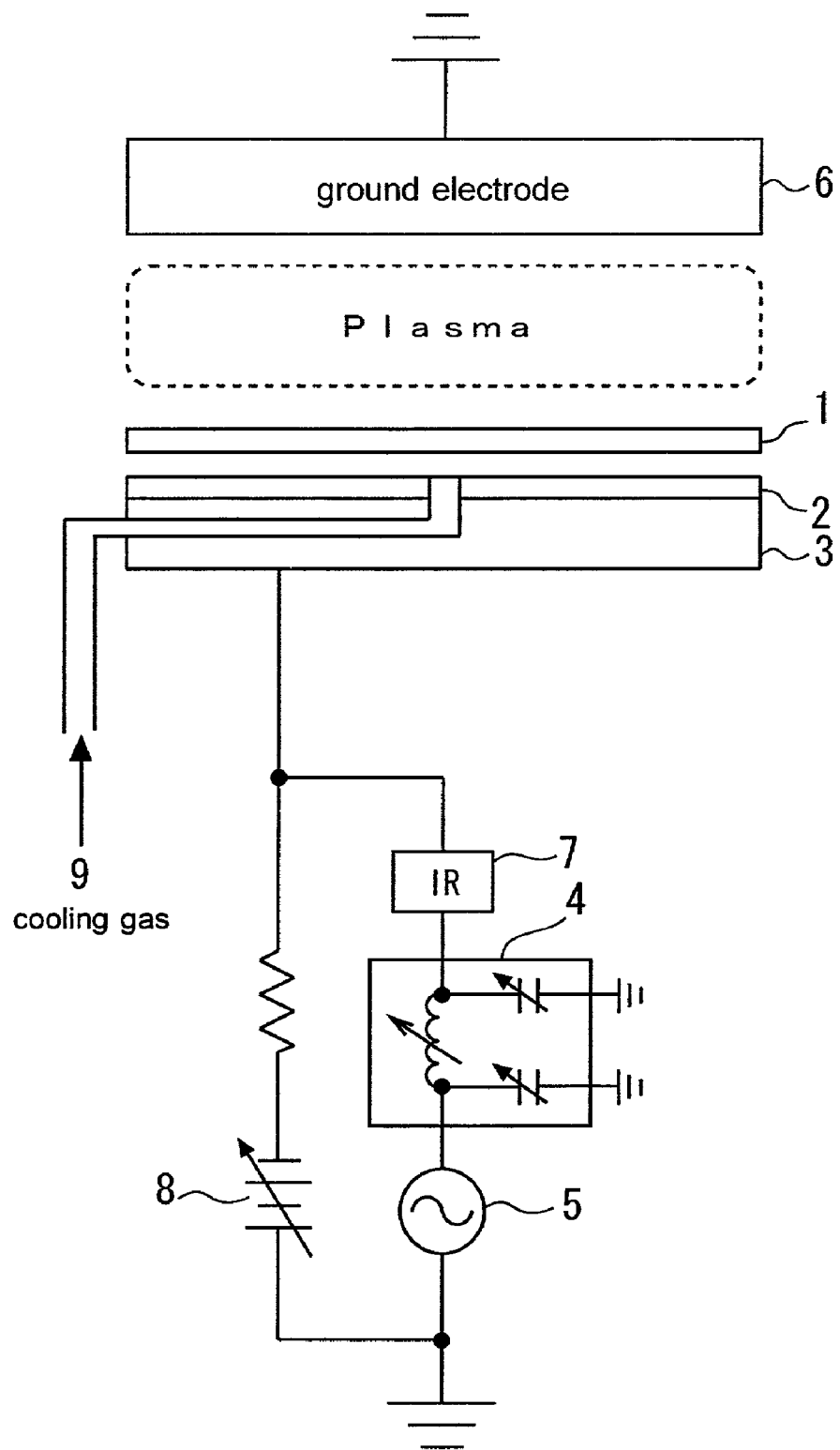
FIG. 3 is a view for describing the structure of a conventional plasma processing system.

FIG. 1 is a view for describing the structure of a plasma processing system (wafer etching system) according to a first embodiment of the present invention. In FIG. 1, those elements, which are the same as the elements shown in FIG. 3, are assigned the same reference numerals and explanations.

In FIG. 1, reference numeral 1 designates a wafer serving as a substrate to be processed. For instance, a Si wafer 8 inches in diameter having a film to be etched, e.g., an oxide film ($SiO_2$), provided thereon is used as the wafer 1. Reference numeral 2 designates an insulating coating provided on a power electrode 3 disposed in a processing chamber (not shown). The wafer 1 is to come into contact with the insulating coating 2. A film including metal, e.g., titania or alumina, is used as material of the insulating coating 2. The power electrode 3 chucks and retains the wafer 1 thereon by way of the insulating coating 2. The power electrode 3 is formed from, for example, an aluminum alloy A5052. Reference numeral designates a matching circuit which matches the voltage of a high-frequency power supply 5 serving as RF feeding apparatus to the voltage applied to the power electrode 3.

The high-frequency power supply 5 produces a voltage for generating plasma to be used for effecting an etching reaction. Further, the high-frequency power supply 5 produces a voltage to be used for securing the wafer 1 to the power electrode 3. A supply voltage of the high-frequency power supply 5 is about 1 KV, and a power supply frequency is 13.56 MHz. Reference numeral 6 designates a ground electrode serving as a ground at the time of development of the plasma. The size of the ground electrode 6 corresponds with the diameter of the wafer 1. An aluminum alloy A5052 is used as a material of the ground electrode 6. Reference numeral 7 designates avariable resistorused for adjusting the matching circuit 4. Thereby, the matching circuit 4 matches the power electrode 3 and the high-frequency power supply 5. Reference numeral 8 designates a DC (direct current) power supply capable of switching between application of a negative voltage and application of a positive voltage. Reference numeral 9 designates a cooling gas supplied from a cooling gas system (not shown), the cooling gas 9 being used for removal the wafer 1. For example, $N_2$ gas is used as the cooling gas 9. The insulating coating 2 and the DC power supply 5 substantially serves as a retaining/removal apparatus of the wafer 1.

Reference numeral 10 designates a voltage probe which is connected to a power line of the high-frequency power supply 5 and that of the DC power supply 8. The voltage probe 10 is used for measuring the impedance of a feeding system including the power electrode 3 serving as the sample table. Pt, Au, or Cu, which has high conductivity, is used as material of the voltage probe 10. Reference numeral 11 designates an impedance detection circuit serving as detection apparatus connected to the voltage probe 10. The impedance detection circuit 11 measures variations in electrostatic capacitance attributable to the length of a gap between the wafer 1 and the power electrode 3. Further, the impedance detection circuit 11 measures variations in plasma impedance attributable to the length of a gap between the wafer 1 and the power electrode 3.

Reference numeral 12 designates a pressure indicator, and 13 designates a flow regulator. The pressure indicator 12 and the flow regulator 13 are used for controlling a flow rate of the cooling gas 9. Here, the cooling gas 9 is used for cooling the power electrode 3, and used for removal the wafer 1.

A digital pressure sensor is used for the pressure indicator 12, and a mass flow controller is used for the flow regulator 13.

Next, procedures for processing a wafer will be described.

First, the wafer 1 is transported onto the power electrode 3 by use of unillustrated transport apparatus, such as a robot.

Next, a positive power of about 1 KV is applied from the DC power supply 8 to the power electrode 3. Thus, the wafer 1 is secured to the power electrode 3 by means of the electrostatic attracting force developing in the power electrode 3. At this time, an electrostatic attracting force of 600 g or more is exerted on the power electrode 3 in the vertical direction.

Next, a high-frequency voltage, which is used for developing plasma between the power electrode 3 and the ground electrode 6, is applied from the high-frequency power supply 5 to the power electrode 3. Thereby, an etching process of the wafer 1 is performed. At this time, the matching circuit 4 matches the voltage of the high-frequency power supply 5 to the voltage applied to the power electrode 3.

After completion of the etching process, the polarity of the voltage, which is supplied by DC power supply 8 for chucking the wafer 1, is switched in the DC power supply 8. Namely, a maximum of −2 KV of negative voltage is applied to the power electrode 3. Thereby, electrical charges of the power electrode 3 are removed.

Next, the cooling gas 9 for removal of the wafer 1 is supplied, thus removing the wafer 1 from the power electrode 3.

In this case, the impedance detection circuit 11 detects variations in electrostatic capacitance stemming from the length "d" (see FIG. 1) of a gap between the wafer 1 and the power electrode 3. Namely, the impedance detection circuit 11 detects variations in plasma impedance stemming from variations in the length "d" of the gap between the power electrode 3 and the wafer 1. Here, the gap arises when the wafer 1 is removed from the power electrode 3. Therefore, removal of the wafer 1 can be confirmed. At this time, if the wafer 1 has actually been removed (dechucked) from the power electrode 3, the impedance detection circuit 11 outputs a signal "charge-removal OFF" (see FIG. 1) indicating that the wafer 1 has been removed from the power electrode 3.

Finally, the wafer 1 removed from the power electrode 3 is transported from the power electrode 3 through use of transport apparatus, such as a robot.

As mentioned above, in the first embodiment, the impedance detection circuit 11, which is connected to the power line of the high-frequency power supply 5 and to that of the DC power supply 8 by way of the voltage probe 10, is used for detecting variations in electrostatic capacitance developing between the power electrode 3 including the insulating coating 2 and the wafer 1. Namely, plasma impedance, which stemmed from variations in the length of the gap "d" between the power electrode 3 and the wafer 1, is detected by the impedance detection circuit 11, thus detecting occurrence of electrostatic chucking failures or the end of removal of electrical charges. Hence, deviation of the wafer 1 on the power electrode 3 can be detected, thereby enabling stable processing and transport of the wafer 1. Further, the throughput of the wafer etching system (plasma processing system) can be improved by means of shortening a dechucking (removal) process time. Further, an electrostatic chucking voltage can be optimized. Further, chucking and dechucking of the wafer 1 can be stabilized, and detection of removal of electrical charges from the wafer 1 can be stabilized.

Second Embodiment

Figure 2:
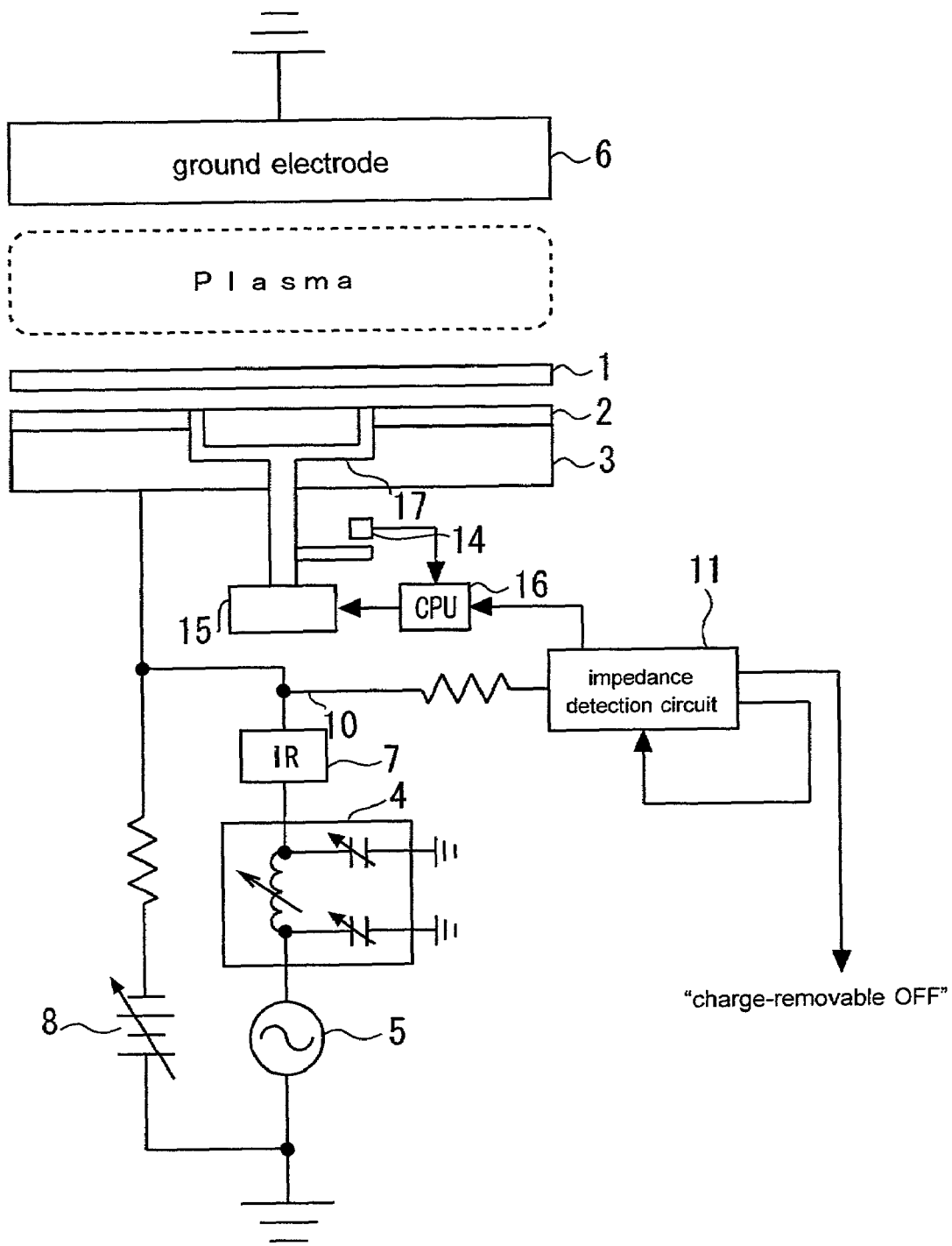
FIG. 2 is a view for describing the structure of a plasma processing system according to a second embodiment of the present invention.

FIG. 2 is a view for describing the structure of a plasma processing system according to a second embodiment of the present invention. In FIG. 2, those elements which are the same as the elements shown in FIG. 1 are assigned the same reference numerals, and repetition of detailed explanations thereof are omitted.

In FIG. 2, reference numeral 14 designates a position detection sensor, and 15 designates a vertically-slidable actuator. The position detection sensor 14 and the vertically-slidable actuator 15 are used for removing the wafer 1 from the power electrode 3. A translucent or reflection-type photo-sensor is used as the position detection sensor 14, and an air cylinder or a mechanism for actuating a ball screw and a linear guide by means of a motor is used for the vertically-slidable actuator 15. Reference numeral 16 designates a CPU for controlling the vertically-slidable actuator 15 in accordance with an output from the position detection sensor 14 and an output from the impedance detection circuit 11. Reference numeral 17 designates a raise pin for raising the power electrode 3 serving as the sample table. In other respect, the wafer etching system is identical in configuration with that shown in FIG. 1. The vertically-slidable actuator 15 and the CPU 16 are served as vertically-slidable actuator (described in "WHAT IS CLAIMED IS").

Next, procedures for processing a wafer will be described.

First, the wafer 1 is transported onto the power electrode 3 by use of unillustrated transport apparatus, such as a robot.

Next, a positive power of about 1 KV is applied from the DC power supply 8 to the power electrode 3. Thus, the wafer 1 is secured to the power electrode 3 by means of the electrostatic attracting force developing in the power electrode 3. At this time, an electrostatic attracting force of 600 g or more is exerted on the power electrode 3 in the vertical direction.

Next, a high-frequency voltage (13.56 MHz and 1W to 1 KW) is supplied from the high-frequency power supply 5 to the power electrode 3, for developing plasma between the power electrode 3 and the ground electrode 6. Thereby, an etching process of the wafer 1 is performed. At this time, the matching circuit 4 matches the voltage of the high-frequency power supply 5 to the voltage applied to the power electrode 3.

After completion of the etching process, the polarity of the voltage, which is supplied by DC power supply 8 for chucking a wafer, is switched in the DC power supply 8. Namely, a maximum of −2 KV of negative voltage is applied to the power electrode 3. Thus, electrical charges of the power electrode 3 are removed.

Subsequently, the vertically-slidable actuator is actuated, thus removing the wafer 1. The position detection sensor 14 detects a stroke for raising the wafer 1 and supplies a detection output to the CPU 16. The CPU 16 controls the vertically-slidable actuator 15 on the basis of the detection result, thereby adjusting a stroke for raising the wafer 1. At this time, the wafer 1 is raised from the power electrode 3 by 0.5 to 15 mm.

In this case, the impedance detection circuit 11 detects variations in electrostatic capacitance stemming from variations in the length of the gap "d" between the wafer 1 and the power electrode 3: that is, plasma impedance stemming from variations in the length of the gap between the power electrode 3 and the wafer 1 arising when the wafer 1 is removed. Thus, removal (dechucking) of the wafer 1 can be checked. If the wafer 1 has been actually removed from the power electrode 3, the impedance detection circuit 11 outputs a signal "charge-removable OFF" indicating that the wafer 1 has been removed from the power electrode 3.

The information about variations in electrostatic capacitance detected by the impedance detection circuit 11: that is, information about the plasma impedance stemming from variations in the length of the gap "d" between the power electrode 3 and the wafer 1, is delivered to the CPU 16. Subsequently, the CPU 16 computes an appropriate amount of raise of the wafer 1 from the power electrode 3. The result of computation is fed back to control of the vertically-slidable actuator 15, thereby stably etching the wafer 1. Finally, the wafer 1 removed from the power electrode 3 is transported from the power electrode 3 through use of transport apparatus, such as a robot.

As mentioned above, in the second embodiment, an appropriate amount of raise of the wafer 1 from the power electrode 3 is computed on the basis of the information about variations in electrostatic capacitance detected by the impedance detection circuit 11: that is, information about the plasma impedance stemming from variations in the length of the gap "d" between the power electrode 3 and the wafer 1. The result of computation is fed back to control of the vertically-slidable actuator 15, thereby stably etching the wafer 1. Further, the throughput of the wafer etching system can be improved by means of shortening a wafer removal (dechucking) process time.

Third Embodiment

The first and second embodiments have described the wafer etching system utilizing plasma. However, the present invention is not limited to such an etching system. The present invention can also be applied to a plasma ashing system, a chemical-vapor deposition (CVD) system, or a system using an electrostatic chucking device.

This invention, when practiced illustratively in the manner described above, provides the following major effects:

According to a first aspect of the present invention, a plasma processing system comprises a processing chamber into and from which processing gas is inlet and outlet; a pair of electrodes disposed so as to mutually oppose within the processing chamber; a RF feeding apparatus for generating plasma between the pair of electrodes; a retaining/removal apparatus for retaining a substrate to be processed on and removal from a sample table while one of the pair of electrodes is taken as the sample table; and a detection apparatus for detecting the electrostatic-chucking state of the substrate and for detecting removal state of electrical charges from the substrate, on the basis of variations in impedance arising between the sample table and the substrate.

By means of this configuration, deviation of the wafer can be detected, thereby realizing stable processing and transport of the wafer. Further, throughput attributable to shortening of the wafer dechucking time can be improved. Further,the present invention yields an advantage of ability to optimize an electrostatic chucking voltage, and to stabilize dechucking of the wafer and removal of electrical charges from the wafer.

In a preferred variation of the first aspect of the present invention, the detection apparatus has an impedance detection circuit connected to a power line of the RF feeding apparatus and to a power line of the retaining/removal apparatus by way of a voltage probe, the impedance detection circuit detecting plasma impedance stemming from variations in the length of a gap between the sample table and the substrate, the impedance detection circuit detecting an electrostatic chucking failure or the end of removal of electrical charges. Accordingly, there is yielded an advantage of ability to contribute to realization of stable processing and transport of a wafer, improved throughput attributable to shortening of a wafer dechucking time, an optimal electro static chucking voltage, and stable dechucking of a wafer and removal of electrical charges from a wafer.

In a preferred variation of the first aspect of the present invention, the retaining/removal apparatus has an insulating coating provided on the surface of the sample table on which the substrate is retained, the retaining/removal apparatus having a DC application apparatus for applying a DC voltage to the sample table: the substrate is chucked and retained by the sample table bymeans of the electrostatic force developing between the substrate and the sample table, the plasma being taken as ground: and the electrical charges, which are still remained on the substrate and on the insulating coating formed on the sample table, are removed by means of applying, to the sample table, a voltage for generating electrical charges opposite in polarity to those accumulated on the substrate and those on the insulating coating of the sample table, the substrate being removed from the sample table.

Accordingly, there is yielded an advantage of ability to contribute to realization of stable processing and transport of a wafer, improved throughput attributable to shortening of a wafer dechucking time, an optimal electro static chucking voltage, and stable dechucking of a wafer and removal of electrical charges from a wafer.

In a preferred variation of the first aspect of the present invention, the RF feeding apparatus feeds a high-frequency output for producing plasma, within a range of at least 1 W to 2.0 KW. There is yielded an advantage of ability to produce plasma without fail.

In a preferred variation of the first aspect of the present invention, the retaining/removal apparatus outputs a chucking voltage for retaining the substrate and outputs a charge-removal voltage for removal the substrate, in the form of a DC voltage within a range of −2.0 KV to 2.0 KV. There is yielded an advantage of ability to enable dechucking and removal of a wafer without fail.

In a preferred variation of the first aspect of the present invention, the detection apparatus detects variations in plasma impedance when the length of a gap arising between the substrate and the sample table is changed within a range of 0.5 to 15 mm. Hence, there is yielded an advantage of ability to detect deviation of a wafer with high accuracy.

In a preferred variation of the first aspect of the present invention, the detection apparatus detects a change in plasma impedance on the basis of variations in the length of the gap between the substrate and the sample table, the sample table being lowered under lowering pressure of cooling gas inlet from the sample table, the detection apparatus detecting an electrostatic chucking failure. Accordingly, there is yielded an advantage of ability to realize an optimal electrostatic chucking voltage and stable dechucking of a wafer and stable detection of removal of electrical charges from a wafer.

In a preferred variation of the first aspect of the present invention, the retaining/removal apparatus has, as an alternative to the DC voltage application apparatus, a position detection sensor and a vertically-slidable actuator, the vertically-slidable actuator removing the substrate from the sample table on the basis of an output from the position detection sensor.

Accordingly, there is yielded an advantage of ability to realize stable processing and transport of a wafer and improved throughput attributable to shortening of a wafer dechucking time.

According to a second aspect of the present invention, in a plasma processing method for inletting processing gas between a pair of electrodes disposed so as to mutually oppose within a processing chamber, the processing gas being discharged from the processing chamber after processing of a substrate to be processed, the method comprising the steps of: generating plasma between the pair of electrodes; retaining the substrate on a sample table by means of electrostatic chucking while one of the pair of electrodes is taken as the sample table and; removing the substrate from the sample table by means of removing residual electrical charges from the substrate; and detecting electrostatic chucking state of the substrate and removal state of electrical charges from the substrate, on the basis of variations in impedance between the sample table and the substrate.

Accordingly, there is yielded an advantage of ability to contribute to realization of stable processing and transport of a wafer, improved throughput attributable to shortening of a wafer dechucking time, an optimal electrostatic chucking voltage, and stable dechucking of a wafer and removal of electrical charges from a wafer.

In a preferred variation of the second aspect of the present invention, in the step for retaining, plasma impedance varies for reasons of variations in the length of a gap between the substrate and the sample table. Accordingly, there is yielded an advantage of ability to contribute to realization of stable processing and transport of a wafer, improved throughput attributable to shortening of a wafer dechucking time, an optimal electro static chucking voltage, and stable dechucking (removal) of a wafer and removal of electrical charges from a wafer.

In a preferred variation of the second aspect of the present invention, in the step for retaining, the plasma impedance varies when the length of the gap between the substrate and the sample table changes within a range of 0.5 to 15 mm. Hence, there is yielded an advantage of ability to detect deviation of a wafer with high accuracy.

In a preferred variation of the second aspect of the present invention, in the step for retaining, plasma impedance varies in accordance with variations in the length of a gap between the substrate and the sample table lowered under lowering pressure of cooling gas inlet from the sample table, the plasma impedance arising between the sample table and the substrate. Accordingly, there is yielded an advantage of ability to realize stable processing and transport of a wafer and improved throughput attributable to shortening of a wafer dechucking time.

In a preferred variation of the second aspect of the present invention, in the step for removing, plasma impedance varies for reasons of variations in the length of a gap arising between the substrate and the sample table. Accordingly, there is yielded an advantage of ability to realize stable processing and transport of a wafer and improved throughput attributable to shortening of a wafer dechucking time.

In a preferred variation of the second aspect of the present invention, in the step for removing, the plasma impedance changes when the length of the gap arising between the substrate and the sample table changes within a range of 0.5 to 15 mm. Hence, there is yielded an advantage of ability to detect deviation of a wafer with high accuracy.

In a preferred variation of the second aspect of the present invention, in the step for removing, plasma impedance changes in accordance with variations in the length of a gap developing between the substrate and the sample table, the sample table being lowered under lowering pressure of cooling gas inlet from the sample table. Accordingly, there is yielded an advantage of ability to realize stable processing and transport of a wafer and improved throughput attributable to shortening of a wafer dechucking time.

In a preferred variation of the second aspect of the present invention, in the step for detecting, variations in plasma impedance stemming from variations in the length of a gap between the substrate and the sample table are detected. Thus, the end of removal of electrical charges can be detected. Accordingly, there is yielded an advantage of ability to realize an optimal electrostatic chucking voltage, and stable removal (dechucking) of a wafer and removal of electrical charges from a wafer.

According to a third aspect of the present invention, a method of manufacturing a semiconductor device use the above-mentioned plasma processing system or method. Accordingly, there is yielded an advantage of ability to provide a method of manufacturing a semiconductor device with good productivity and superior quality.

Further, the present invention is not limited to these embodiments, but variations and modifications may be made without departing from the scope of the present invention.

The entire disclosure of Japanese Patent Application No. 2000-403083 filed on Dec. 28, 2000 containing specification, claims, drawings and summary are incorporated herein by reference in its entirety.

What is claimed is:

1. A plasma processing system comprising:
   a processing chamber;
   a pair of electrodes disposed so as to mutually oppose within said processing chamber;
   a RF feeding apparatus for generating plasma between said pair of electrodes;
   a retaining/removal apparatus for retaining a substrate to be processed on and removal from a sample table while one of said pair of electrodes is taken as the sample table; and
   a detection apparatus for detecting the electrostatic-chucking state of the substrate and for detecting removal state of electrical charges from the substrate, on the basis of variations in impedance arising between the sample table and the substrate.

2. The plasma processing system according to claim 1, wherein said detection apparatus has an impedance detection circuit connected to a power line of said RF feeding apparatus and to a power line of said retaining/removal apparatus by way of a voltage probe, said impedance detection circuit detecting plasma impedance stemming from variations in the length of a gap between the sample table and the substrate, said impedance detection circuit detecting an electrostatic chucking failure or the end of removal of electrical charges.

3. The plasma processing system according to claim 1, wherein said retaining/removal apparatus has an insulating coating provided on the surface of the sample table on which the substrate is retained, said retaining/removal apparatus having a DC application apparatus for applying a DC voltage to the sample table:
   the substrate is chucked and retained by the sample table by means of the electrostatic force developing between the substrate and the sample table, the plasma being taken as ground: and
   the electrical charges, which are still remained on the substrate and on the insulating coating formed on the sample table, are removed by means of applying, to the sample table, a voltage for generating electrical charges opposite in polarity to those accumulated on the substrate and those on the insulating coating of the sample table, the substrate being removed from the sample table.

4. The plasma processing system according to claim 1, wherein said RF feeding apparatus feeds a high-frequency output for producing the plasma, within a range of at least 1 W to 2.0 KW.

5. The plasma processing system according to claim 1, wherein said retaining/removal apparatus outputs a chucking voltage for retaining the substrate and outputs a charge-removal voltage for removal the substrate, in the form of a DC voltage within a range of—2.0 KV to 2.0 KV.

6. The plasma processing system according to claim 2, wherein said detection apparatus detects variations in plasma impedance when the length of a gap between the substrate and the sample table is changed within a range of 0.5 to 15 mm.

7. The plasma processing system according to claim 2, wherein said detection apparatus detects a change in plasma impedance on the basis of variations in the length of the gap between the substrate and the sample table, the sample table being lowered under lowering pressure of cooling gas inlet from the sample table, said detection apparatus detecting an electrostatic chucking failure.

8. The plasma processing system according to claim 3, wherein said retaining/removal apparatus has, as an alternative to the DC voltage application apparatus, a position detection sensor and a vertically-slidable actuator, said vertically-slidable actuator removing the substrate from the sample table on the basis of an output from the position detection sensor.

* * * * *